United States Patent [19]

Kinch et al.

[11] Patent Number: 5,144,138
[45] Date of Patent: Sep. 1, 1992

[54] INFRARED DETECTOR AND METHOD

[75] Inventors: Michael A. Kinch, Dallas; C. Grady Roberts, McKinney, both of Tex.

[73] Assignee: Texas Instruments Incorporated, Dallas, Tex.

[21] Appl. No.: 417,931

[22] Filed: Oct. 6, 1989

[51] Int. Cl.$^5$ ............... H01L 25/00; H01L 27/14; G01T 24/00
[52] U.S. Cl. ............... 250/332; 250/370.08; 250/370.13; 250/338.4; 357/30; 357/90; 437/5
[58] Field of Search ............. 250/370.12, 370.13, 250/332, 338.4, 370.08; 357/30 B, 30 F, 30 H, 90; 437/5

[56] References Cited

U.S. PATENT DOCUMENTS

| | | | |
|---|---|---|---|
| 3,889,284 | 6/1975 | Schiel | 437/37 X |
| 4,024,569 | 5/1977 | Hawrylo et al. | 357/90 X |
| 4,383,269 | 5/1983 | Capasso | 357/16 X |
| 4,599,632 | 7/1986 | Bethea et al. | 357/90 X |
| 4,684,812 | 8/1987 | Tew et al. | 250/370.08 X |
| 4,764,261 | 8/1988 | Ondris et al. | 437/5 X |

*Primary Examiner*—Stephen C. Buczinski
*Attorney, Agent, or Firm*—Richard A. Stoltz; Richard L. Donaldson; Jay Cantor

[57] ABSTRACT

Photocapacitive detectors with varying bandgap $Hg_{1-x}Cd_xTe$ (604) for two color detection and one color detection with increased potential well capacity. Preferred embodiments include a transparent insulated gate (608) on a top layer (632) of $Hg_{0.8}Cd_{0.2}Te$ over a lower layer (634) of $Hg_{0.83}Cd_{0.27}Te$ for detection of two infrared colors by varying gate potential to either confine the potential well to the top layer or to extend the potential well to both layers. Also, methods of compositionally grading the $Hg_{1-x}Cd_xTe$ by fluid transport plus diffusion.

14 Claims, 18 Drawing Sheets

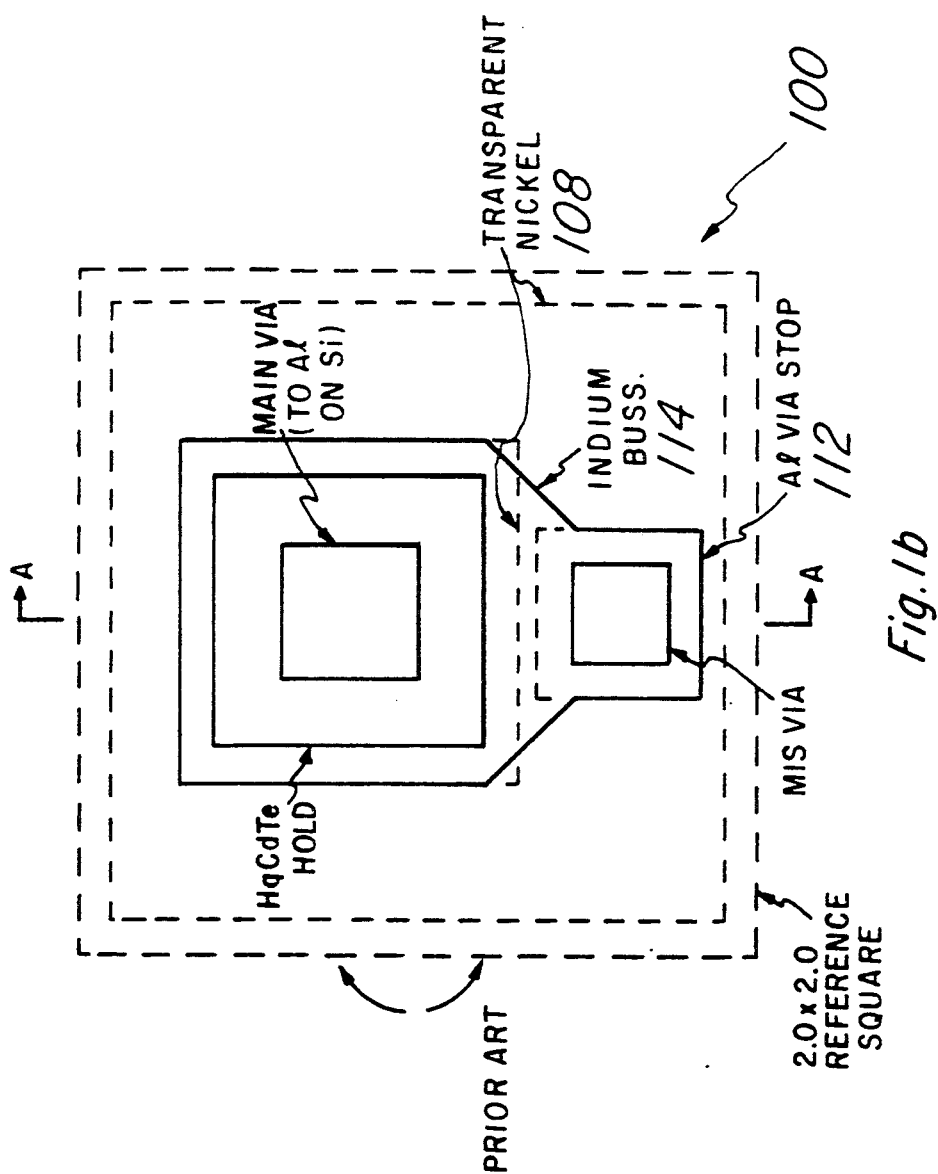

INFRARED DETECTOR AND METHOD

STATEMENT AS TO RIGHTS TO INVENTIONS MADE UNDER FEDERALLY SPONSORED RESEARCH AND DEVELOPMENT

The U.S. Government has a paid-up license in this invention and the right in limited circumstances to require the patent owner to license others on reasonable terms as provided for by the terms of DARPA Contract No. N00014-86-C-2389.

CROSS-REFERENCE TO RELATED APPLICATIONS

Copending U.S. applications Ser. Nos. 769,993, filed Aug. 26, 1985 (Kinch and Simmons) and 021,373, filed Mar. 3, 1987 (Borrello and Roberts) and cofiled application 417,999, filed Oct. 6, 1989 (Tregilgas, Beck, and Borrello) disclose related subject matter. These cross-referenced applications are assigned to the assignee of this application.

BACKGROUND OF THE INVENTION

1. Field of the Invention

The present invention relates to infrared radiation detectors and, more particularly, to small bandgap semiconductor infrared detectors and methods of fabrication.

2. Description of the Related Art

Detection of infrared radiation emitted by warm bodies provides an important method for night vision (perception without visible light). Infrared detectors are of various types and include narrow bandgap semiconductors structured as photodiodes or photocapacitors. Alloys of mercury telluride and cadmium telluride, generically denoted $Hg_{1-x}Cd_xTe$, are extensively employed as the photosensitive narrow bandgap semiconductor. Indeed, $Hg_{0.8}Cd_{0.2}Te$ has a bandgap of about 0.1 eV which corresponds to a photon wavelength of 12 $\mu$m and $Hg_{0.83}Cd_{0.27}Te$ a bandgap of about 0.24 eV corresponding to a photon wavelength of 5 $\mu$m; and these two wavelengths are in the two atmospheric windows (3-5 $\mu$m and 8-12 $\mu$m) of greatest interest for infrared detectors.

An infrared imager incorporating an array of detectors with each detector a MIS photocapacitor in $Hg_{1-x}Cd_xTe$ is disclosed in U.S. Pat. No. 4,684,812 (Tew and Lewis); FIGS. 1a-b are cross sectional elevation and plan views of a single detector. The detector operates as follows: a negative voltage (typically −2 volts relative to the $Hg_{1-x}Cd_xTe$ substrate) is applied to the gate to form a depletion region in the n-type $Hg_{1-x}Cd_xTe$; the gate is then electrically isolated; incident infrared photons penetrate the gate and create electron-hole pairs in the $Hg_{1-x}Cd_xTe$; the photogenerated minority carrier holes accumulate in the $Hg_{1-x}Cd_xTe$ at the interface with the gate insulator and form an inversion layer which reduces the size of the depletion region and lowers the absolute value of the gate potential; the gate potential is sensed which reveals the incident infrared photon flux; the inversion layer and depletion region are collapsed by applying a positive voltage to the gate; and then the cycle is repeated. The detector is typically operated at liquid nitrogen temperatures to limit the thermal creation of electron-hole pairs in the $Hg_{1-x}Cd_xTe$; a bandgap of 0.1 eV is only about 4 kT at room temperature.

An increase in the magnitude of the gate voltage implies a larger depletion region and better performance. However, too large a gate voltage leads to breakdown in the $Hg_{1-x}Cd_xTe$: electron-hole pairs are generated without any incident infrared photons which results in spurious detection results. The breakdown electric field is on the order of 1 Volt/$\mu$m for narrow bandgap $Hg_{1-x}Cd_xTe$.

The probability that an incident infrared photon will create an electron-hole pair in the $Hg_{1-x}Cd_xTe$ depends upon the wavelength (energy) of the photon and the bandgap of the $Hg_{1-x}Cd_xTe$. If the photon energy is less than the bandgap, then the probability of creating an electron-hole pair is essentially zero; if the photon energy is equal to or somewhat greater than the bandgap, then the probability is large and the photons have a penetration depth (1/e not absorbed) on the order of 1 to 10 $\mu$m; and if the photon energy is much larger than the bandgap (such as three times the bandgap), then the probability of creating more than one electron-hole per incident photon becomes substantial and the penetration depth decreases to about 0.1 to 1 $\mu$m. Blackbody radiation of a 300° K. body has a spectral peak at about 10 $\mu$m and drops rapidly for shorter wavelengths, so the flux of 8-12 $\mu$m wavelength photons incident on a detector is typically much greater than the flux of 3-5 $\mu$m wavelength photons. This means that if the detector is made of $Hg_{0.8}Cd_{0.2}Te$, then both 8-12 $\mu$m and 3-5 $\mu$m wavelength photons will be detected, but the 8-12 $\mu$m wavelength photons will greatly outnumber the 3-5 $\mu$m wavelength photons; whereas if the detector is made of $Hg_{0.83}Cd_{0.27}Te$, then only the 3-5 $\mu$m wavelength photons will be detected. Essentially, only a limited range of wavelengths (a single "color") is detected, and to detect two (or more) infrared colors requires two (or more) MIS photocapacitors of differing bandgap $Hg_{1-x}Cd_xTe$ alloys in the same detector.

Thus, the known MIS photocapacitor detectors have the problems of low breakdown electric field associated with the small bandgaps of $Hg_{1-x}Cd_xTe$ alloys and single color sensitivity.

SUMMARY OF THE INVENTION

The present invention provides infrared detectors made of $Hg_{1-x}Cd_xTe$ with two or two or more x values in the same photocapacitor. This solves the problems of low breakdown electric field and single color operation by using a wider bandgap $Hg_{1-x}Cd_xTe$ near the gate to limit the electric field in the narrow bandgap $Hg_{1-x}Cd_xTe$ and to control the depletion region extent in the narrow bandgap $Hg_{1-x}Cd_xTe$ by use of two different gate voltage levels. Preferred embodiments include an array of MIS photocapacitors formed on a heterostructure substrate of $Hg_{1-x}Cd_xTe$ with $x \approx 0.2$ having a 1 to 4 $\mu$m thick epilayer with $x \approx 0.27$ for two color operation or a 1 $\mu$m thick epilayer with $x \approx 0.5$ for dark current suppression. The substrate itself may consist of an epilayer of $Hg_{1-x}Cd_xTe$ with $x \approx 0.2$ having a thickness of approximately 10 $\mu$m (an absorption thickness), and this layer may or may not be grown by the same growth technique used to grow the larger x value capping layer.

BRIEF DESCRIPTION OF THE DRAWINGS

The drawings are schematic for clarity.

FIGS. 1a-b are cross sectional elevation and plan views of a prior art MIS photocapacitor detector;

DESCRIPTION OF THE PREFERRED EMBODIMENTS

Figure 1A:
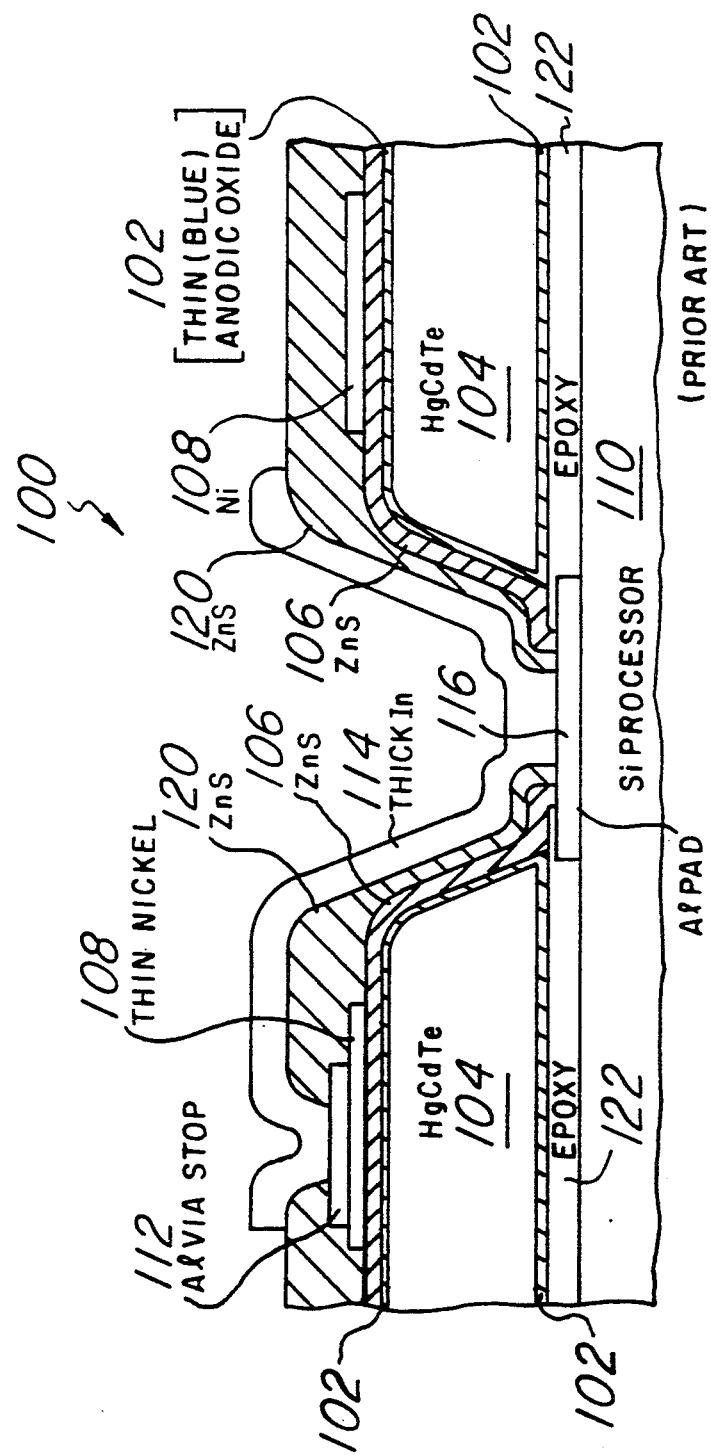

The preferred embodiment detectors are most easily understood after a review of the operation of the prior art detector described in the Background. FIGS. 1a–b illustrate in cross sectional elevation and plan views a single detector (denoted by reference numeral 100) of a prior art $Hg_{1-x}Cd_xTe$ photocapacitive infrared imager (array of detectors) and show anodic oxide passivation 102 of n-type $Hg_{1-x}Cd_xTe$ 104 together with ZnS gate dielectric 106 and transparent nickel gate 108. FIG. 1a is a section taken along line a—a in FIG. 1b. The Figures also indicate an underlying silicon processor 110 for the imager, the metal connection (112-114-116) of gate 108 to silicon processor 110, ZnS insulation 120, and epoxy 122 affixing the $Hg_{1-x}Cd_xTe$ to the silicon processor. ZnS gate dielectric 106 is typically about 1500 Å thick, anodic oxide 102 is typically about 700 Å thick, and $Hg_{1-x}Cd_xTe$ 104 has $x \approx 0.2$ for detection of 8–12 μm wavelength infrared radiation and $x \approx 0.27$ for detection of 3–5 μm wavelength infrared radiation.

Figure 2A:
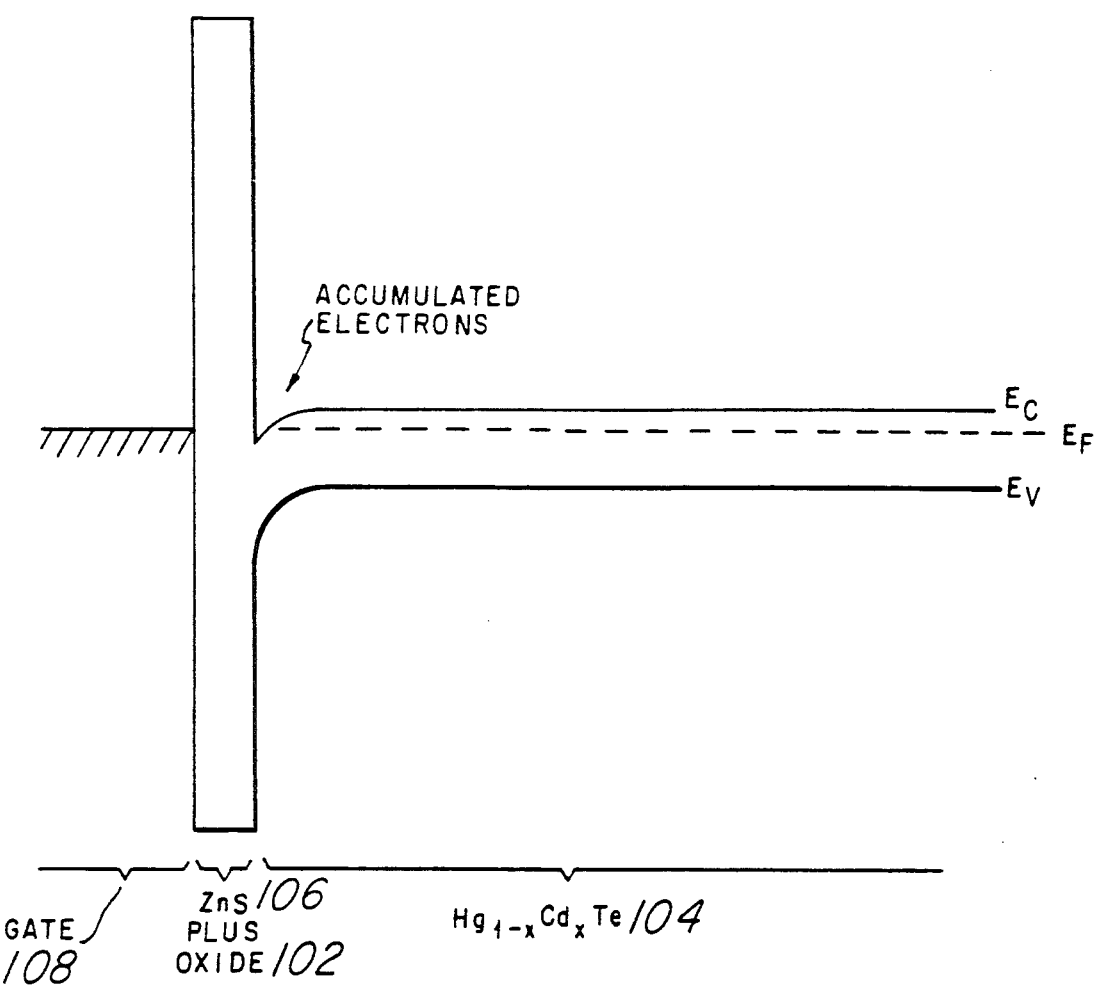
FIGS. 2a–c are band and electric field diagrams for the detector of FIG. 1.
Figure 2C:
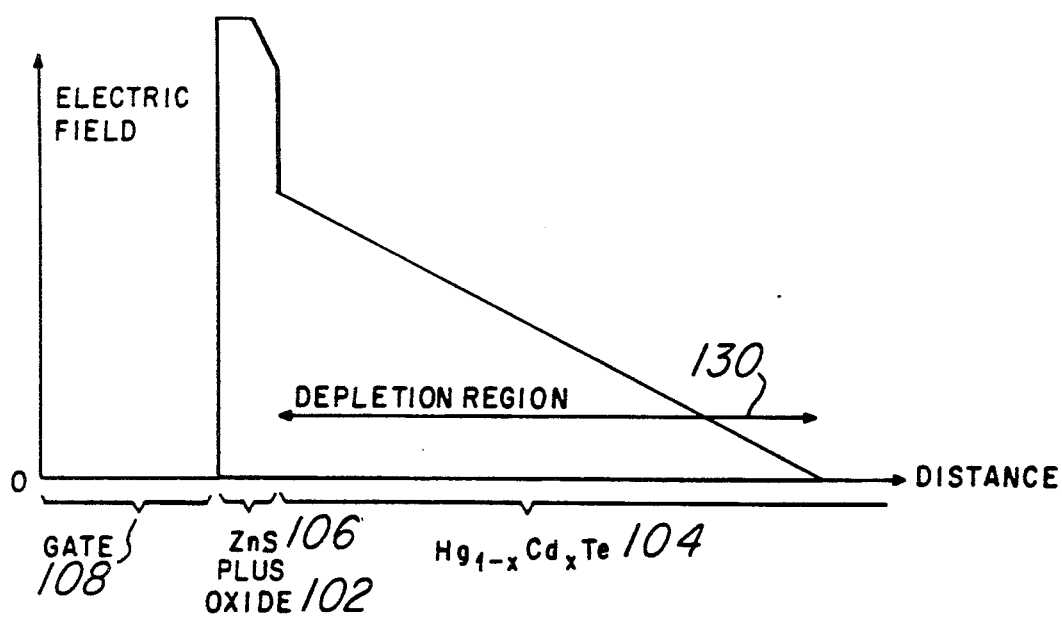
Figure 2B:
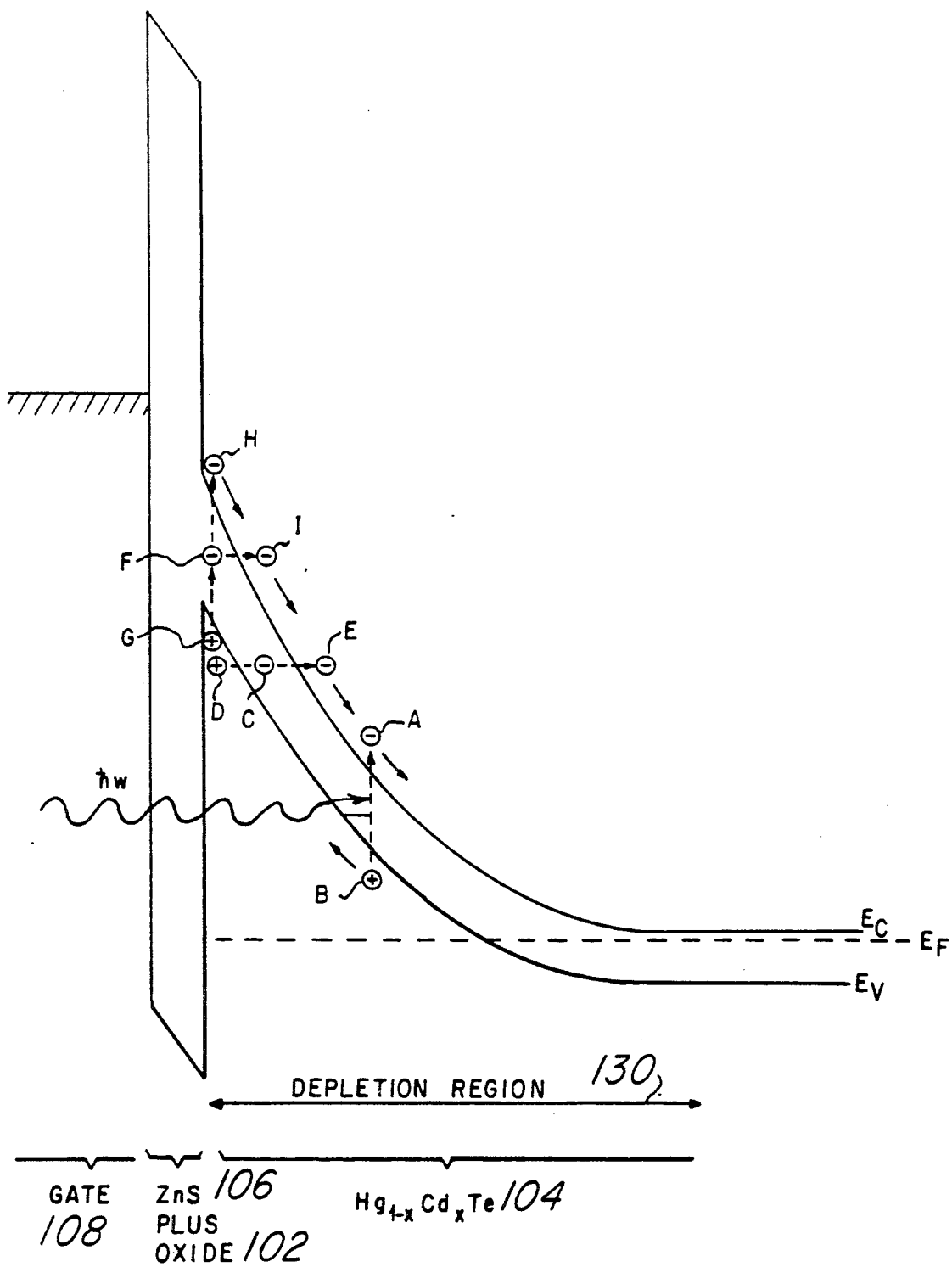

FIG. 2a is a band diagram for detector 100 along a direction from gate 108 through dielectric 106 and oxide 102 into $Hg_{1-x}Cd_xTe$ 104 with no bias applied to gate 108. FIG. 2a shows that the $Hg_{1-x}Cd_xTe$ surface is accumulated; this is due to fixed positive charge in the anodic oxide 102. FIG. 2b is analogous to FIG. 2a but with a bias of about $-2$ volts applied to gate 108 which creates depletion region 130.

FIG. 2b illustrates the mechanism of detection of infrared photons: an electron in the valence band absorbs an incident photon and is excited into the conduction band (electron labelled "A") and leaves behind a hole ("B") in the valence band. This hole drifts under the influence of the electric field in the depletion region to the interface of $Hg_{1-x}Cd_xTe$ 104 with anodic oxide 102 and contributes to an inversion layer at the interface. The amount of charge in the inversion layer is proportional to the incident flux of infrared photons of energy larger than the bandgap of $Hg_{1-x}Cd_xTe$ 104 and the charge is sensed by the change of the gate potential. Holes that are created outside of depletion region 130 may diffuse into the depletion region and also be collected into the inversion layer at the interface.

FIG. 2b also illustrates possible mechanisms of hole creation in the absence of incident infrared photons: this is "dark current" which limits detector performance. An electron can tunnel from the valence band to an unoccupied midbadgap state (electron "C") leaving behind a hole ("D") that also drifts to the inversion layer. An electron in a mid-bandgap state can vacate the midbandgap state and tunnel into the conduction band ("E"). An electron can be thermally excited from the valence band into an unoccupied surface state at the interface (electron "F") leaving behind a hole ("G") which is in the inversion layer, and an electron in a surface state can be thermally excited into the conduction band (electron "H") or can tunnel into the conduction band (electron "F") thereby leaving the surface state unoccupied. Other hole creation mechanisms not illustrated include electrons from the valence band being thermally excited into unoccupied midbandgap states leaving behind holes, and the electrons in midbandgap states being thermally excited into the conduction band. Also, direct tunneling or thermal excitation from the valence band to the conduction band can occur. The density of midbandgap states and surface states depends upon the $Hg_{1-x}Cd_xTe$ material quality and passivation layer quality.

Increasing the magnitude of the gate bias increases the depth of the depletion region 130 so that more photogenerated holes can be collected and a larger change in gate potential can occur. However, increasing the magnitude of the gate bias increases the electric field and band bending which implies a higher probability of electron tunneling (the tunneling distance is shorter) and increased dark current. The breakdown electric field, $E_{bd}$, is defined as the electric field above which the tunneling dark current dominates the background photogenerated current, and is a limiting parameter for the detector. The breakdown electric field varies as the square of the bandgap because, heuristically, the tunneling barrier to a midbandgap state is triangular with height and width each proportional to the bandgap. Of course, the electric field in $Hg_{1-x}Cd_xTe$ 104 has its maximum magnitude at the interface with anodic oxide 102, and thus the tunneling would be greatest at the interface. With uniform doping of $Hg_{1-x}Cd_xTe$ 104, the electric field magnitude varies as shown in FIG. 2c. The apparent discontinuity of the electric field magnitude at the $Hg_{1-x}Cd_xTe$/oxide interface reflects the collected charge in the inversion layer.

Figure 3:
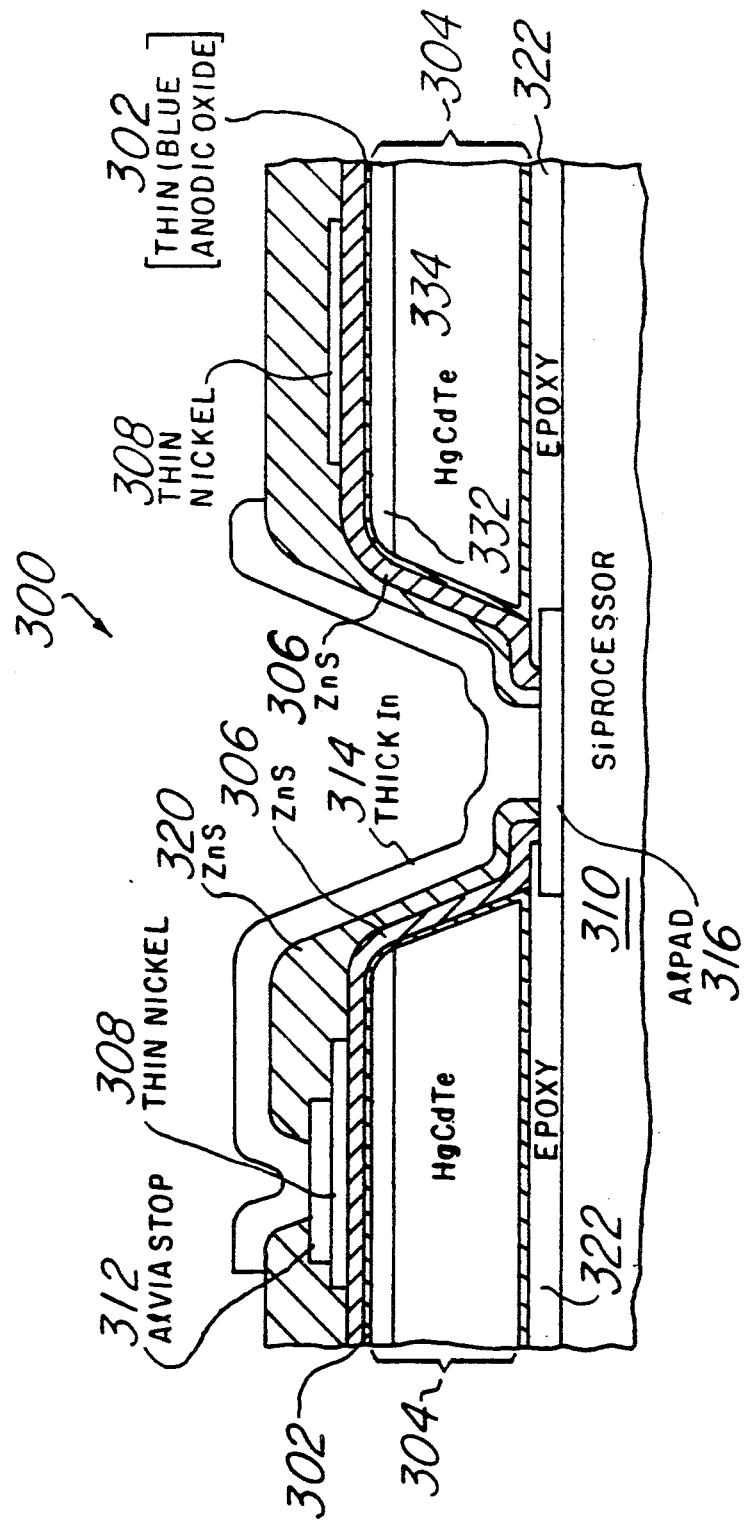
FIG. 3 is a cross sectional elevation view of a first preferred embodiment detector.

FIG. 3 is a cross sectional elevation view of first preferred embodiment $Hg_{1-x}Cd_xTe$ MIS photocapacitive infrared detector (denoted by reference numeral 300) and shows anodic oxide passivation 302 of $Hg_{1-x}Cd_xTe$ 304 together with ZnS gate dielectric 306 and nickel gate 308. Detector 300 is analogous to detector 100, and FIG. 3 also shows underlying silicon processor 310, metal connection (312-314-316) of gate 308 to silicon processor 310, ZnS insulation 320, and epoxy 322 affixing the $Hg_{1-x}Cd_xTe$ to the silicon processor. ZnS gate dielectric 306 is typically about 1500 Å thick, and anodic oxide 302 is typically about 700 Å thick. In contrast to $Hg_{1-x}Cd_xTe$ 104 in detector 100, $Hg_{1-x}Cd_xTe$ 304 includes layer 332 of $Hg_{0.83}Cd_{0.27}Te$ and of 4 μm thickness on layer 334 of $Hg_{0.8}Cd_{0.2}Te$. The use of heterostructure $Hg_{1-x}Cd_xTe$ 304 permits both two color operation and larger gate biases and available potential well capacity, as described in the following.

Figure 4A:
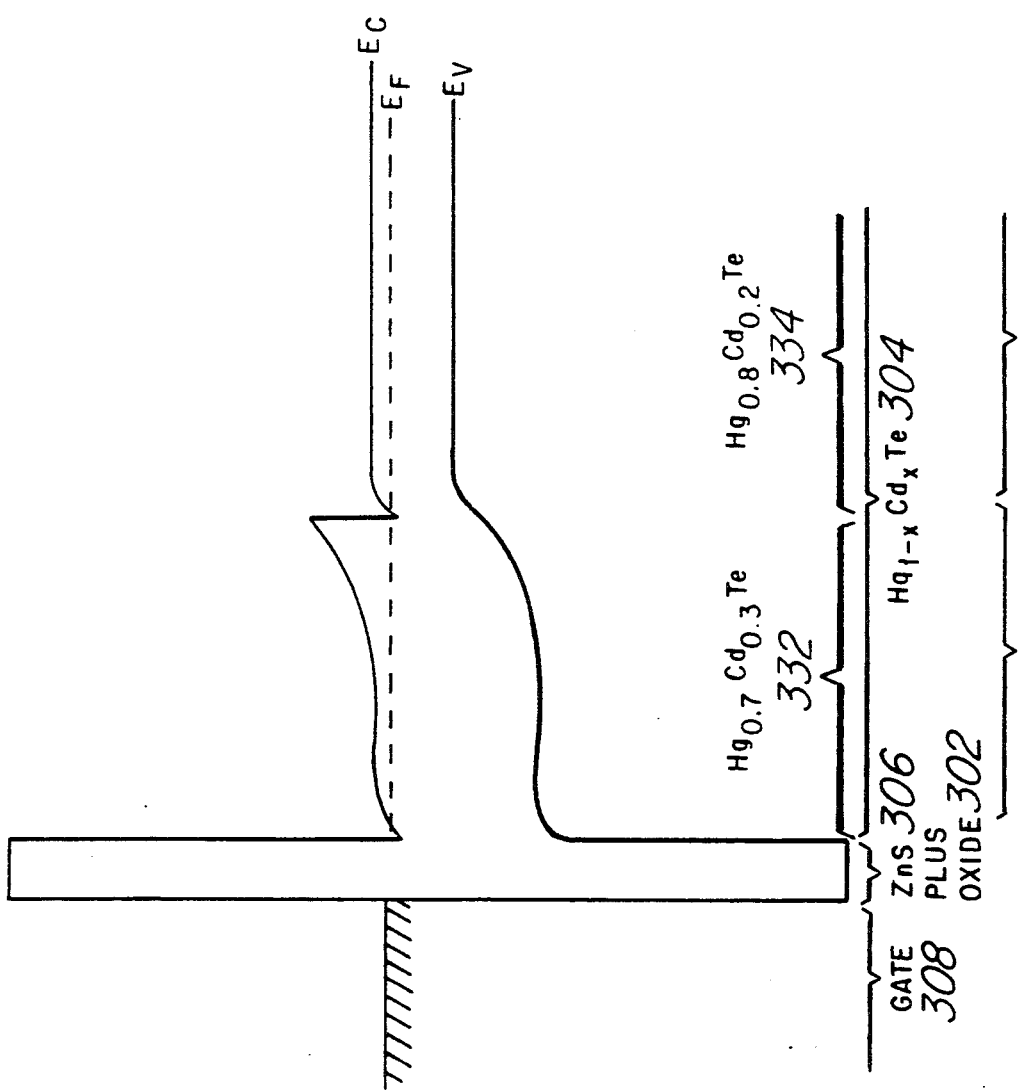
FIGS. 4a–c are band diagrams for the detector of FIG. 3.
Figure 4B:
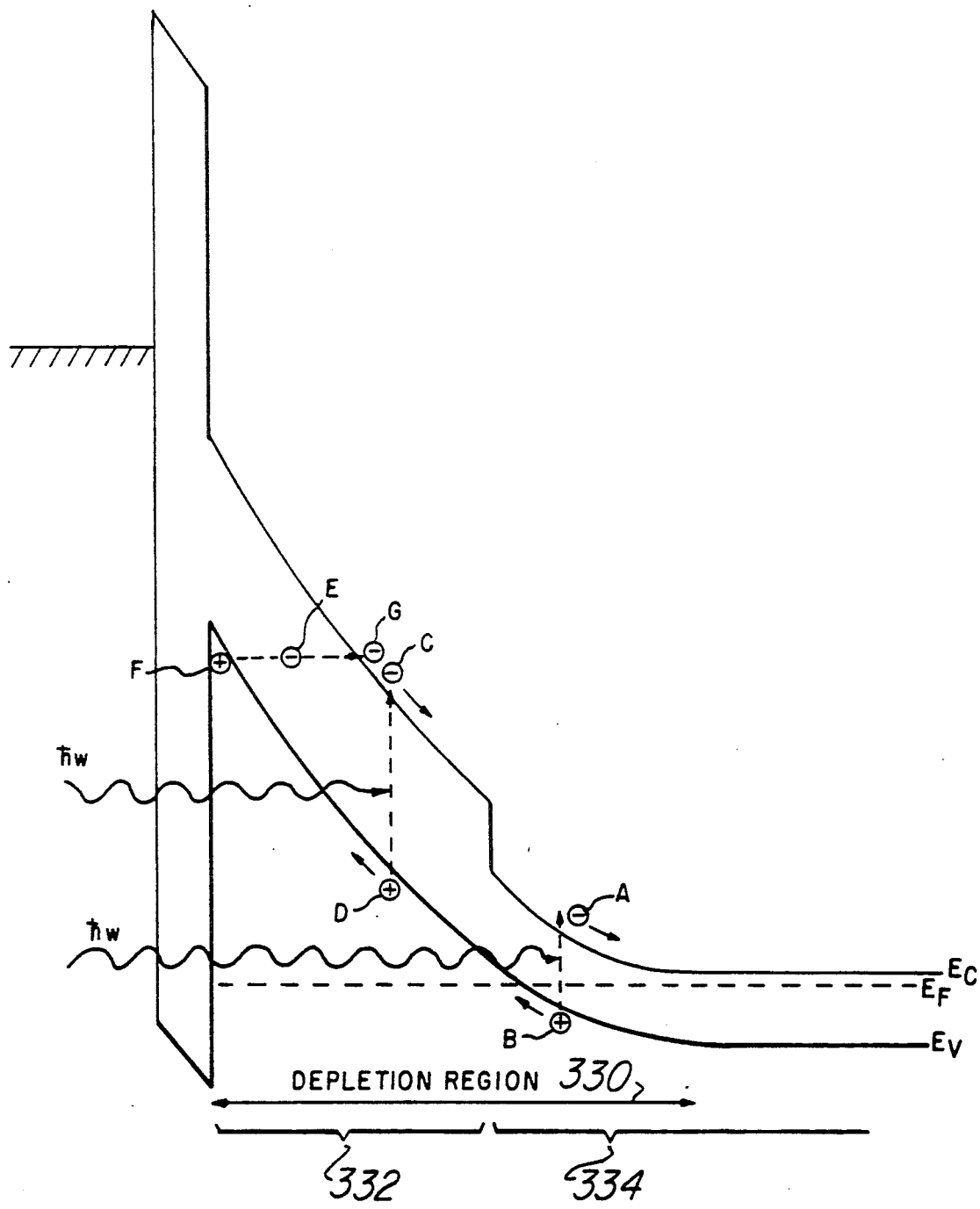
Figure 4C:
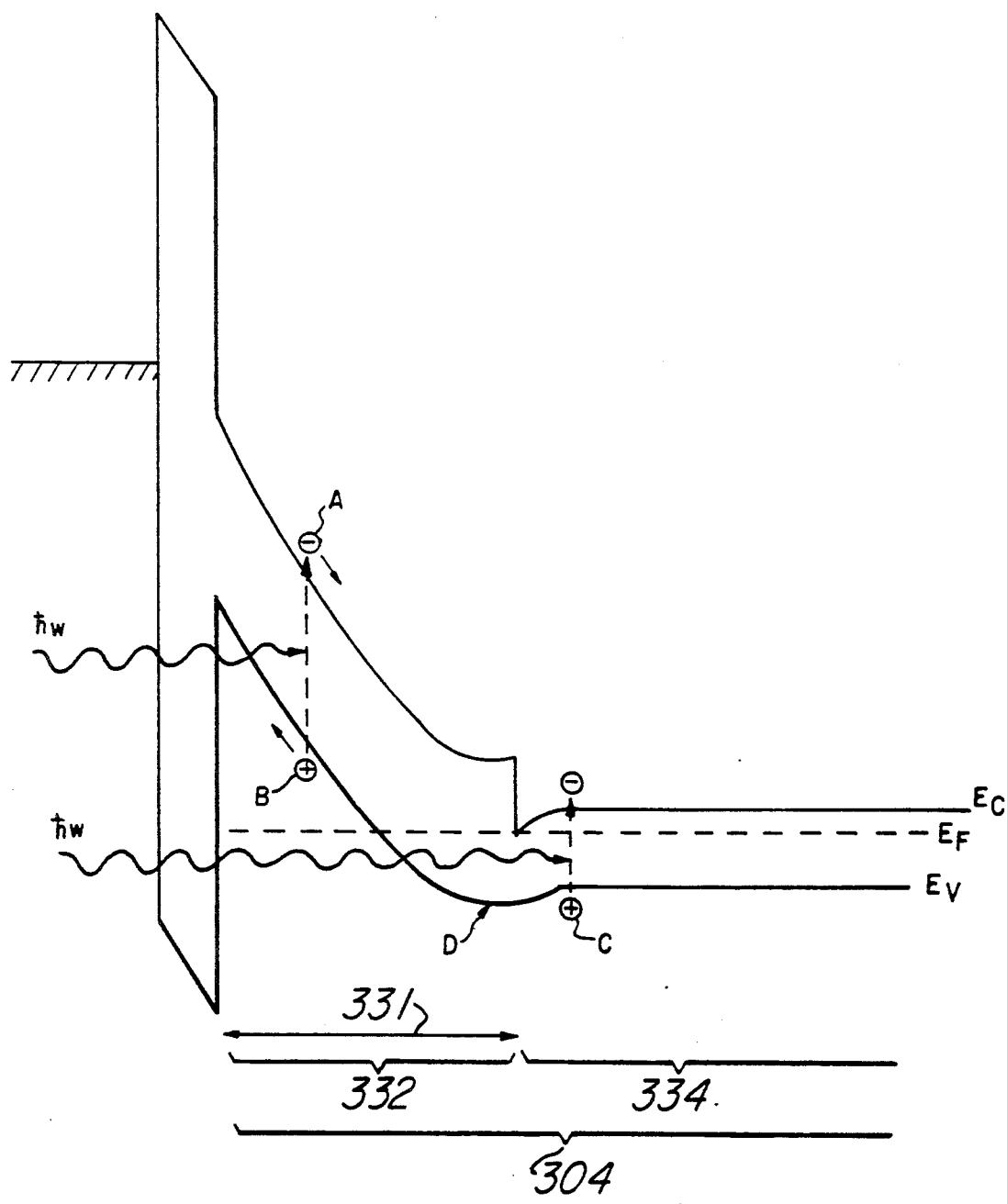

FIG. 4a is a band diagram for detector 300 along a direction from gate 308 through dielectric 306 and oxide 302 into $Hg_{1-x}Cd_xTe$ 304 with no bias applied to gate 308; the conduction band discontinuity at the interface of layers 332 and 334 results in a depletion region in wide bandgap layer 332 and an accumulation region in narrow bandgap layer 334. No discontinuity in the valence band is shown, although a small discontinuity may exist. FIG. 4b is analogous to FIG. 4a but with a bias (for example −3 volts) applied to gate 308 which creates depletion region 330 that extends through layer 332 into layer 334. Contrarily, FIG. 4c is analogous to FIG. 4a but with a bias applied to gate 308 which creates depletion region 331 that is confined to wide bandgap layer 332. This bias is somewhat smaller than that of FIG. 4b (for example −2 volts).

Detector 300 detects 8-12 μm wavelength photons by using the larger gate bias (FIG. 4b): an electron in the valence band in narrow bandgap layer 334 absorbs an incident photon and is excited into the conduction band (heuristic electron labelled "A" in FIG. 4b) and leaves behind a hole ("B") in the valence band that drifts to an inversion layer at the interface of wide bandgap layer 332 with anodic oxide 302. This is the same as with detector 100, except the incident photons pass through wide bandgap layer 332 which is transparent to them. Photons with 3-5 μm wavelength are also detected by absorption in wide bandgap layer 332: electron "C" is excited into the conduction band leaving behind hole "D". The same excitation could occur in narrow bandgap layer 334, but the penetration depth of photons with energies just above the bandgap for layer 332 is about 1 μm and decreases with increasing energy.

Contrary to detector 100, detector 300 can also detect 3-5 μm wavelength photons while excluding detection of 8-12 μ wavelength by use of the lower gate bias illustrated in FIG. 4c: 3-5 μm wavelength photons are absorbed in wide bandgap layer 332 with electron "A" excited into the conduction band leaving behind hole "B". The same excitation could occur in narrow bandgap layer 334, but the penetration depth of photons with energies just above the bandgap for layer 332 is about 1 μm and decreases with increasing energy. Photons with 8-12 μm wavelength pass through wide bandgap layer 332 and are absorbed in narrow bandgap layer 334; however, the generated holes ("C") are precluded from collection into the inversion layer by the barrier ("D") in the valence band due to the heterojunction.

Because the flux of 3-5 μm wavelength photons typically is minimal compared to the flux of 8-12 μm wavelength photons for thermal detection (target temperatures about 300° K.), the absorption in wide bandgap layer 332 is not significant with the larger gate bias. In any event, the results of 3-5 μm wavelength detection could just be subtracted from the 8-12 μm wavelength detection to eliminate this double counting. Thus even higher temperature targets (such as 500° K. where the spectral peak is at a wavelength of about 6 μm) can be detected at two colors. In short, two color operation by detector 300 is achieved simply by using two different gate biases. The gate bias can be alternated between the larger and smaller values, or can be repetitively run for a number of detection cycles with one bias and then a (different) number of cycles at the other bias.

FIG. 4b also illustrates a dark current mechanism of an electron tunneling from the valence band into an unoccupied midbandgap state (electron "E") leaving behind a hole ("F") which is collected and then tunneling into the conduction band (electron "G") and leaving behind an unoccupied midbandgap state. This mechanism should be compared to the C-D-E tunneling mechanism of FIG. 2b: because the bandgap of layer 332 is larger than that of $Hg_{1-x}Cd_xTe$ 104, the tunneling distance is greater and the tunneling barrier is higher, and so the dark current is smaller for the same applied gate voltage.

Figure 5:
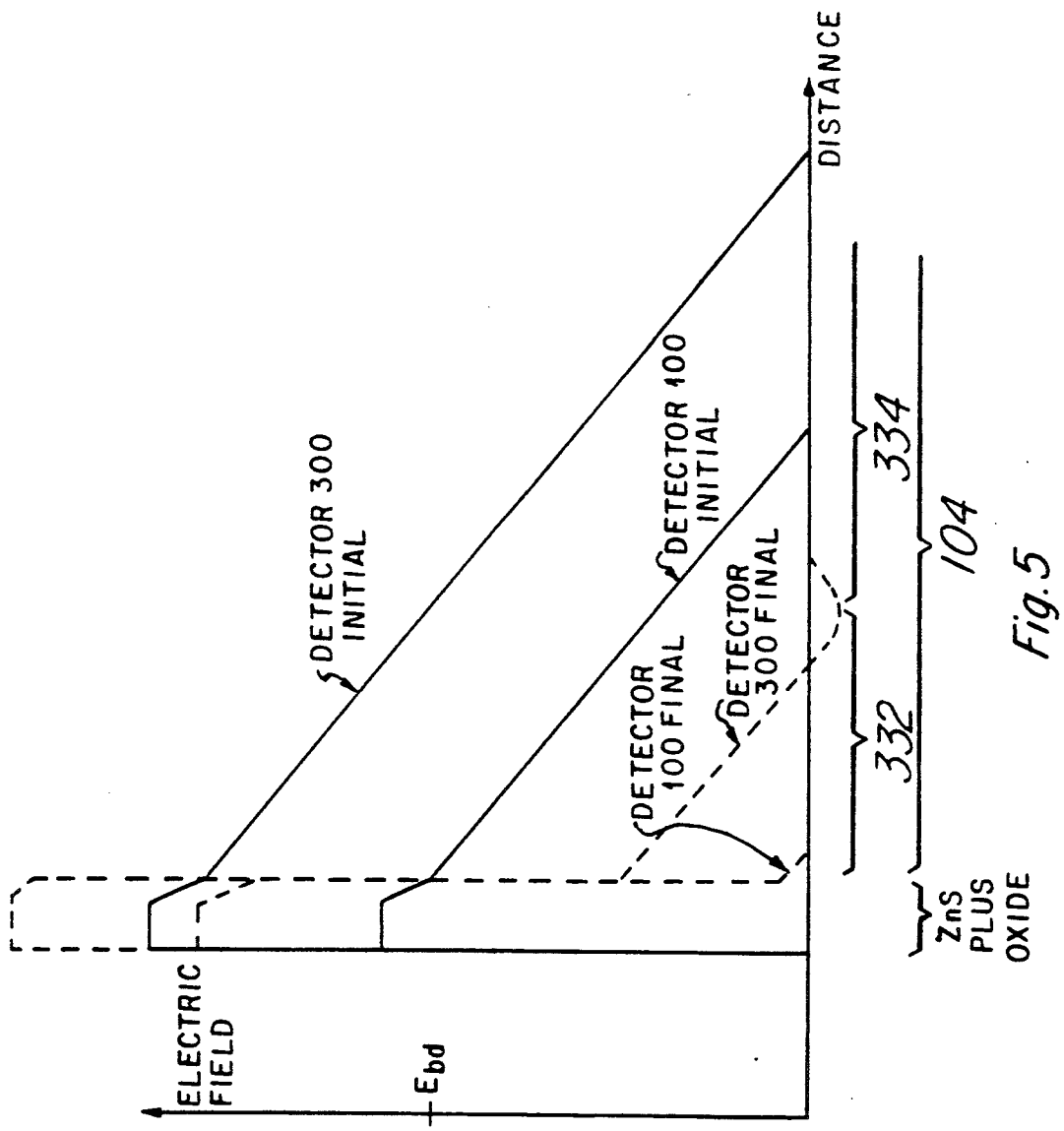
FIG. 5 is an electric field diagram for the detectors of FIGS. 1 and 3.

Detector 300 used as a single color detector with the narrow bandgap $Hg_{1-x}Cd_xTe$ has a greater available potential well capacity than detector 100 with the same narrow bandgap $Hg_{1-x}Cd_xTe$. This increase in available potential well capacity can be seen as follows (a uniform doping level of $N_o$ is presumed for simplicity). The maximum gate bias for detector 100 is the value that results in an electric field value at the $Hg_{1-x}Cd_xTe$/oxide interface equal to the breakdown electric field, $E_{bd}$, immediately after the gate bias is applied. Contrarily, the maximum gate bias for detector 300 is the value that results in an electric field value at the heterojunction 332-334 equal to $E_{bd}$ immediately after the gate bias is applied because the bandgap in layer 332 is large and can support a larger electric field without significant dark current. See FIG. 5 that shows the electric fields for both detectors 100 and 300 as a function of the distance from the corresponding gates; the curves labelled "initial" are for the fields immediately after the gate bias is applied. As photogenerated holes are collected into the inversion layer, the depletion region shrinks, and the electric field in the $Hg_{1-x}Cd_xTe$ depletion region decreases. For detector 100 this continues until the depletion region is almost collapsed; whereas in detector 300 as the depletion region shrinks it becomes confined to wide bandgap layer 334 and the electric field at the heterojunction 332-334 reverses direction due to valence band bending (as illustrated by barrier "D" in FIG. 4c) and photogenerated holes in narrow bandgap layer 334 are prevented from collection into the inversion layer. See FIG. 5 curves labelled "final".

The $Hg_{1-x}Cd_xTe$ surface potential, $\phi_s$, for a given voltage V on the gate is given by:

$$\phi_s = V - \frac{Q}{C} + V_o - \sqrt{2\left(V - \frac{Q}{C}\right)V_o + V_o^2}$$

where Q is the charge in the inversion layer at the surface, C is the insulator capacitance associated with the gate, and $V_o = qN_o\epsilon\epsilon_o/C^2$; $\epsilon$ represents the $Hg_{1-x}Cd_xTe$ dielectric constant. For detectors 100 and 300, $C \approx 5 \times 10^{-8} F/cm^2$, $\epsilon \approx 20$, and hence $V_o < 0.1V$ for $N_o < 10^{15}/cm^3$. Also, for detector 300 during operation $V > Q/C$; hence to a good approximation:

$$\phi_s = V - \sqrt{2VV_o} - \frac{Q}{C},$$

so $\Delta Q = C\Delta\phi_s$ for a constant voltage V on the gate.

The total depletion region width, W, is related to surface potential by $$W^2 = \frac{2\epsilon\epsilon_o\phi_s}{qN_o},$$

hence $$\Delta W = \frac{\epsilon\epsilon_o}{qN_oW}\Delta\phi_s.$$

The maximum value of ΔW that can be allowed before the barrier to hole collection at the heterojunction appears is given by $\Delta W = (W - t)$ where $t$ is the thickness of the wide bandgap layer 332. But the electric field at the heterojunction is initially $E_{bd}$, so $qN_o(W-t) = \epsilon\epsilon_o E_{bd}$, and the maximum value of $\Delta W$ is $E_{bd}\epsilon\epsilon_o/qN_o$. Thus the maximum allowed value of $\Delta\phi_s$ is $E_{bd}W$. Now the maximum value of $W$ is determined by the breakdown electric field, $E_{bd}^*$, of wide bandgap $Hg_{1-x}Cd_xTe$ 332: the electric field is a maximum at the $Hg_{1-x}Cd_xTe$/oxide interface, so $\epsilon\epsilon_o E_{bd}^* = qN_oW$. Thus the maximum value of the change in surface potential is $$\Delta\phi_s = \frac{\epsilon\epsilon_o}{qN_o} E_{bd}E_{bd}^*$$

and thus the available potential well capacity for detection of long wavelength photons is $$\Delta Q = C\frac{\epsilon\epsilon_o}{qN_o} E_{bd}E_{bd}^*$$

The foregoing available potential well capacity for detector 300 may be compared to the available capacity for detector 100:

$$Q_{full} \approx C\phi_s = C\frac{\epsilon\epsilon_o}{2qN_o} E_{bd}^2$$

Thus detector 300 has a gain over detector 100 in available potential well capacity of a factor of $2E_{bd}^*/E_{bd}$, which equals about 5-10.

To achieve the maximum gain in available potential well capacity for the long wavelength photon detection, the wide bandgap should be as wide as possible, this determines $E_{bd}^*$ and thus $W$ (for a given doping concentration). Then the thickness of the wide bandgap layer is determined from $E_{bd}$, $E_{bd}^*$ and $W$ as noted previously. Contrarily, for two color operation, the bandgap of the wide bandgap layer is determined by the second color to be detected, and the thickness of the layer must be large enough to efficiently absorb the second color photons.

A variant of detector 300 for one color operation has the wide bandgap $Hg_{1-x}Cd_xTe$ layer with a doping density different from that of the narrow bandgap $Hg_{1-x}Cd_xTe$. If the doping density of the wide bandgap layer is very small and the dielectric constants, $\epsilon$ and $\epsilon^*$, of the two layers differ, then approximately a factor of $$C_{ox}E_{bd}\frac{\epsilon}{\epsilon^*} t$$

appears in the increase of available potential well capacity, where $C_{ox}$ is the ZnS insulator capacitance/area, and $t$ is the thickness of the wide bandgap layer. For typical values of $C_{ox} = 4 \times 10^{-8} F/cm^2$, $\epsilon/\epsilon^* = 2$, and $t = 1$ μm an enhancement of $8 \times 10^{-8} C/cm^2$ is obtained for $E_{bd} = 1$ V/μm.

Figure 6A:
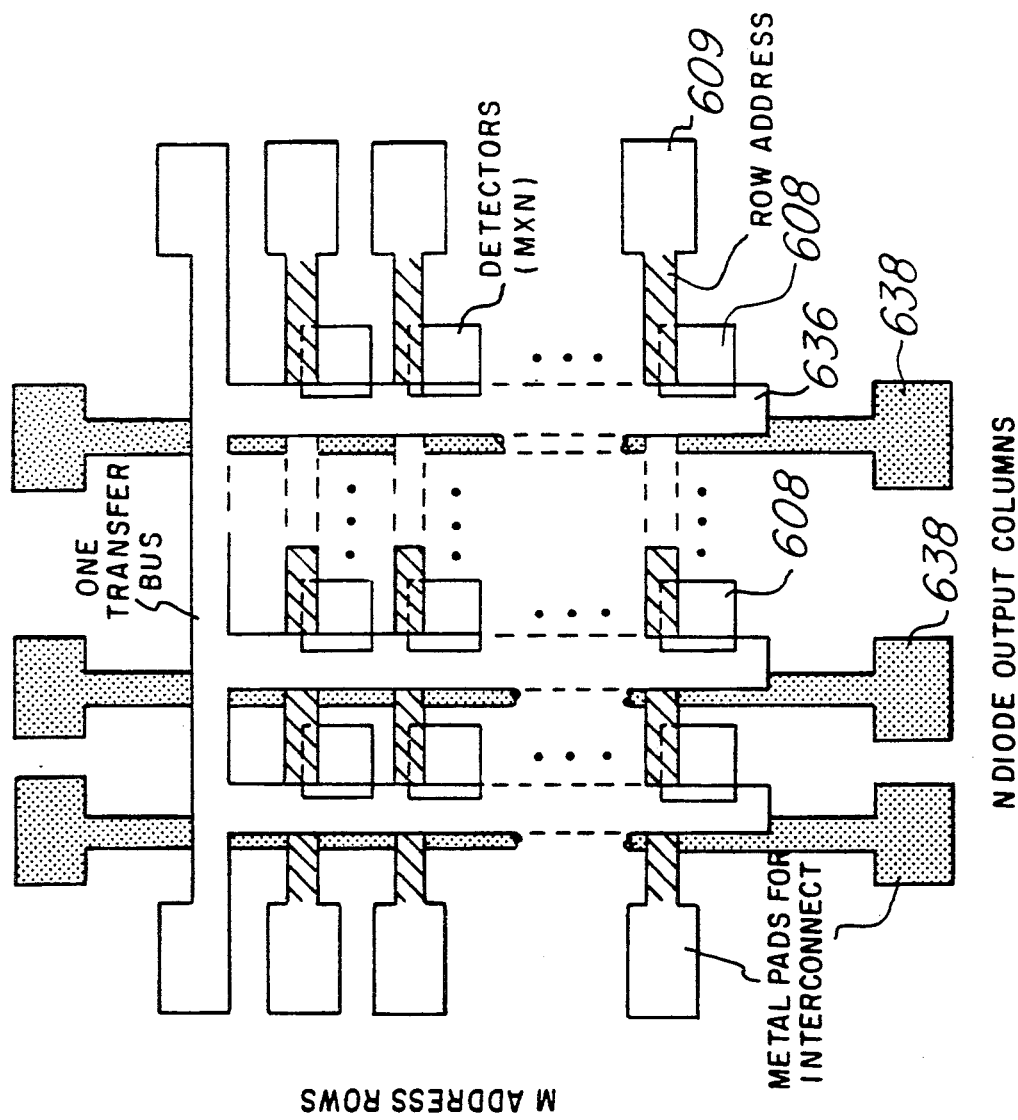
FIGS. 6a–c are plan, cross sectional elevation, and perspective views of a second preferred embodiment detector.
Figure 6B:
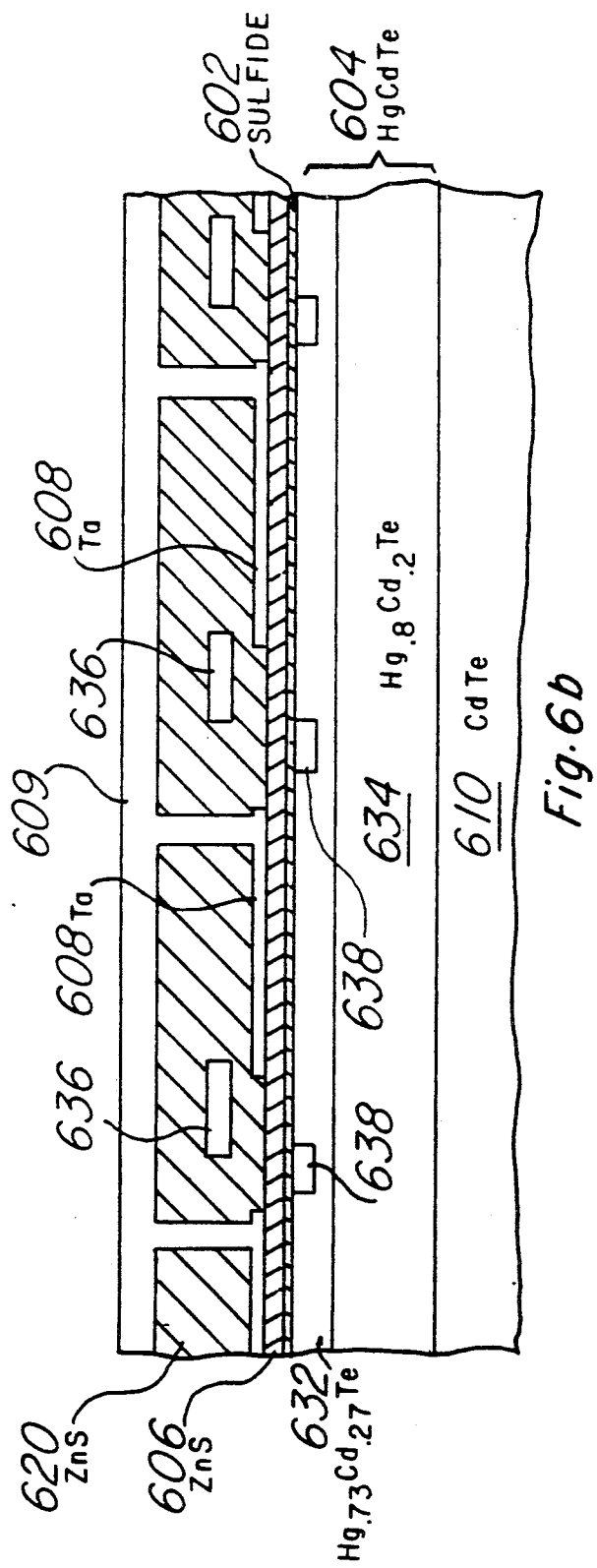
Figure 6C:
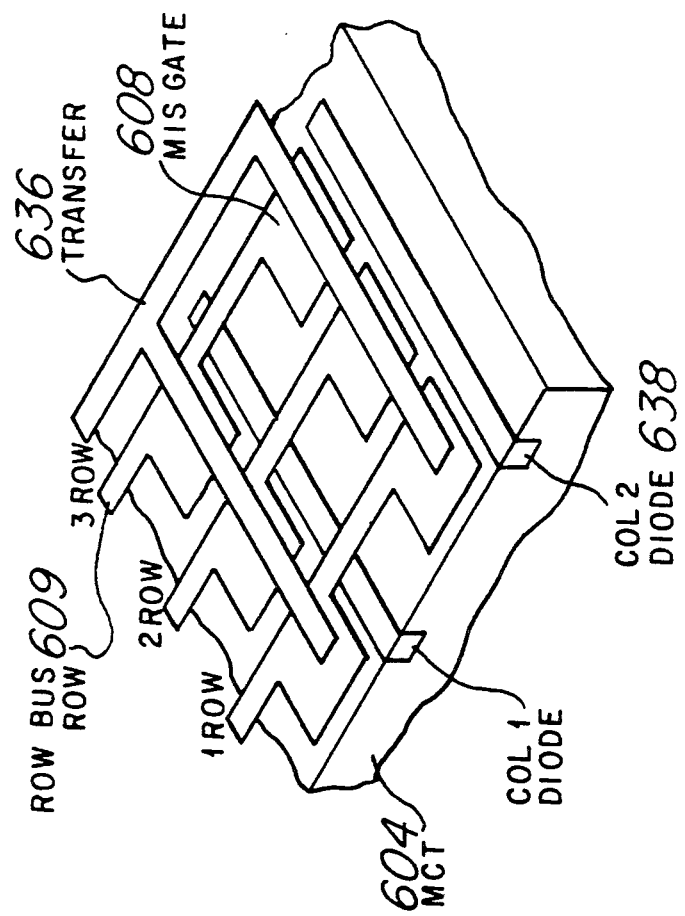

Second preferred embodiment detectors and array of detectors are shown in FIGS. 6a-b and form a charge imaging matrix generally denoted by reference numeral 600. Charge imaging matrix 600 detectors collect photogenerated minority carriers in an inversion layer under an insulated gate analogous to detector 100 but the collected charge is detected by transferring it out of the inversion layer to a diode line in the $Hg_{1-x}Cd_xTe$ which is connected to a sense amplifier. One row of detectors is sensed at a time by simultaneous transfer of charge to adjacent column diode lines. FIG. 6a is a plan view and FIG. 6b is a cross sectional elevation view illustrating $Hg_{1-x}Cd_xTe$ layer 604 on CdTe substrate 610 with 200 Å thick anodic sulfide passivation layer 602, 1500 Å thick ZnS gate dielectric layer 606, 100 Å thick tantalum gate 608, ZnS insulation layer 620, gate row busses 609, and transfer gate 636. Channel stops in the $Hg_{1-x}Cd_xTe$ and surrounding the regions beneath the gates 608 have been omitted for clarity. $Hg_{1-x}Cd_xTe$ layer 604 is a heterostructure of 1 to 4 μm thick n type $Hg_{0.83}Cd_{0.27}Te$ layer 632 on 20 μm thick n-type $Hg_{0.8}Cd_{0.2}Te$ layer 634. Both layer 632 and layer 634 are doped to a carrier concentration of 1 to $10 \times 10^{14}/cm^3$; and layer 632 includes p type diode lines 638 of width 2 μm and depth 1 μm. The gates 608 are 65 μm square and have a center-to-center spacing of 75 μm in both row and colum directions; so an array of 128 by 128 detectors would have a size of about 10 mm square. FIG. 6c is a perspective view with the row busses 609 on the same metal level as the gates 608.

Figure 7A:
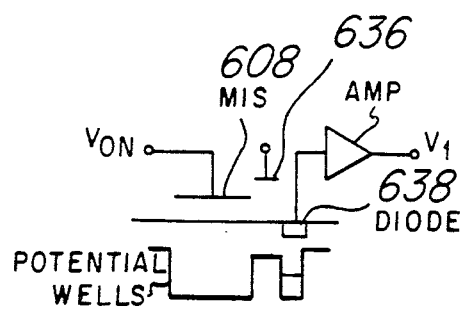
FIGS. 7a–d illustrate the operation of the second preferred embodiment.
Figure 7B:
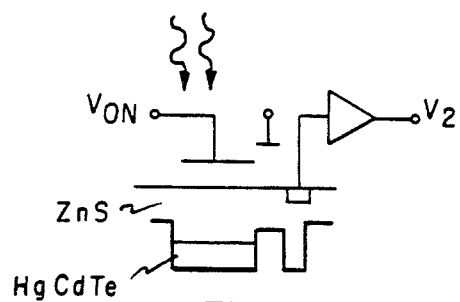
Figure 7C:
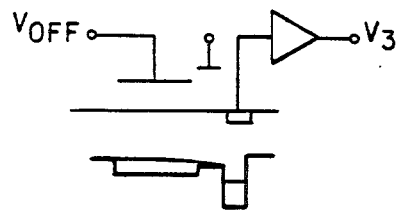
Figure 7D:
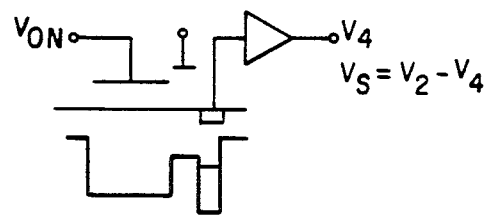

The operation of a single detector of charge imaging matrix 600 is schematically illustrated in FIGS. 7a-d. For detection of 3-5 μm wavelength photons a voltage of $-2$ volts, for example, is applied to gate 608; this creates a depletion region confined to $Hg_{1-x}Cd_xTe$ layer 632 analogous to the depletion region illustrated by band diagram in FIG. 4c for detector 100. See FIG. 7a. Photogenerated holes are collected in the inversion layer at the $Hg_{1-x}Cd_xTe$/sulfide interface for 1,000 μs and partially fill the potential well as shown in FIG. 7b. Just prior to transfer of the collected holes, diode line 638 is reset by applying a negative voltage pulse to remove all holes from the line and then clamp the line to a sense amplifier. Next, the depletion region and inversion layer are collapsed by switching the voltage from $-2$ to $+2$ on gate 608. Transfer gate 636 has a constant negative bias, so when the depletion region and inversion layer are collapsed, the collected holes flow under transfer gate to diode line 638; see FIG. 7c. The $-2$ volt bias is reapplied to gate 608 to reform depletion region, and the charge that was transferred to diode line 638 is sensed by a sense amplifier. See FIG. 7d. The collapsing of the depletion region and inversion layer and the transfer of the collected holes to the diode line takes only a few microseconds, so most of the time the detector is collecting photogenerated holes. Once the depletion region is recreated, the cycle of detection repeats. During the collection time of photogenerated holes, the other rows of detectors are sequentially sensed; thus an entire frame is sensed about every 1,000 μs.

Charge imaging matrix 600 may operate to detect two colors either by varying the gate bias between a high and a low voltage as with detector 300 or by using alternating rows of detectors at high and low gate biases.

Figure 8A:
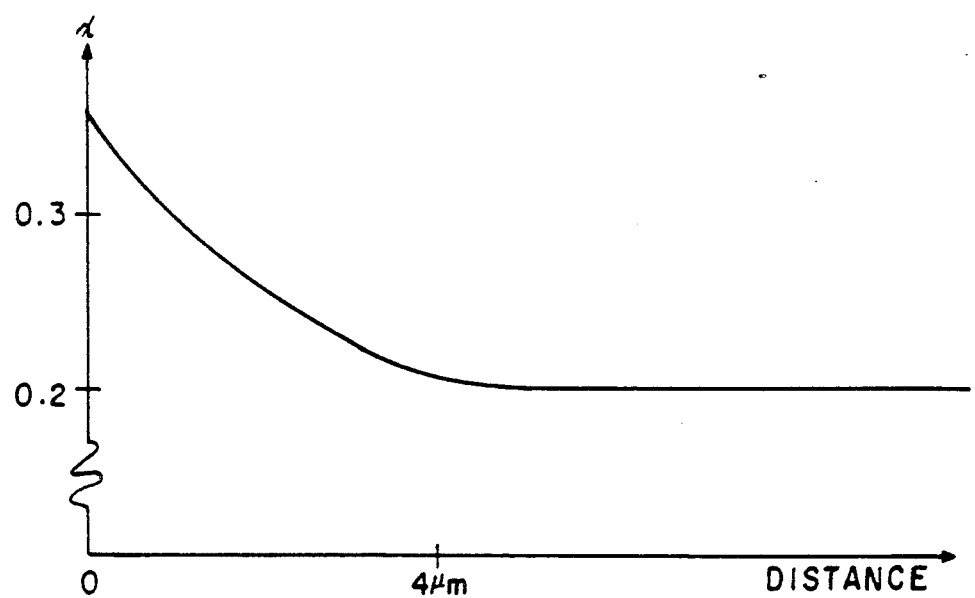
FIGS. 8a–d are electric field and band diagrams for variants of the preferred embodiments.
Figure 8B:
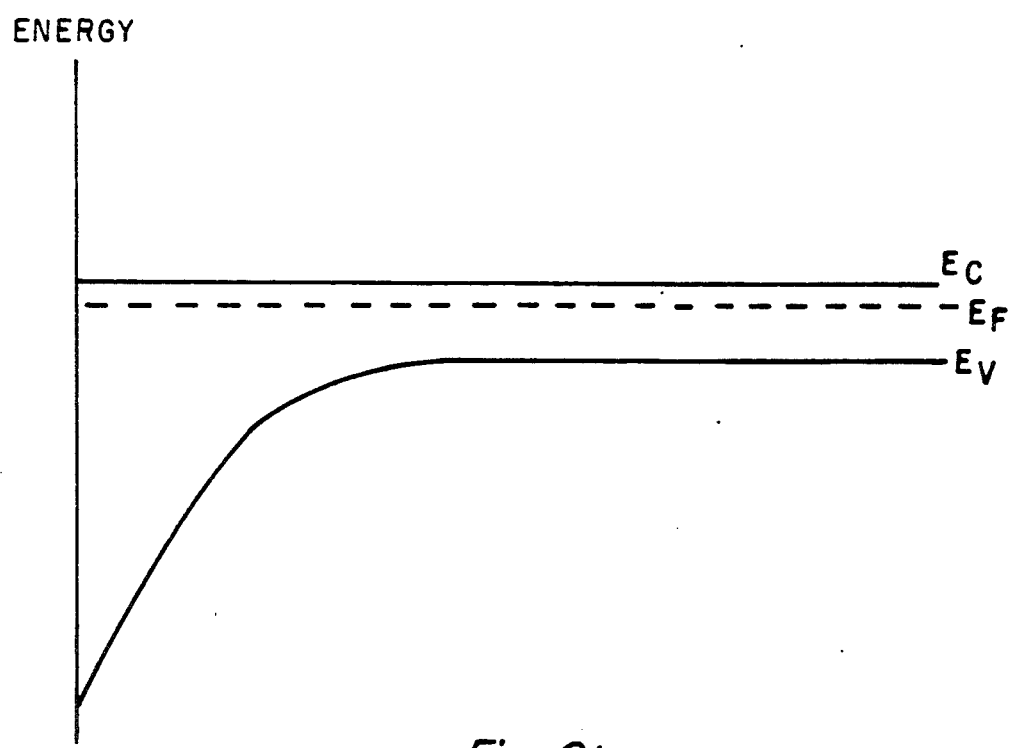
Figure 8C:
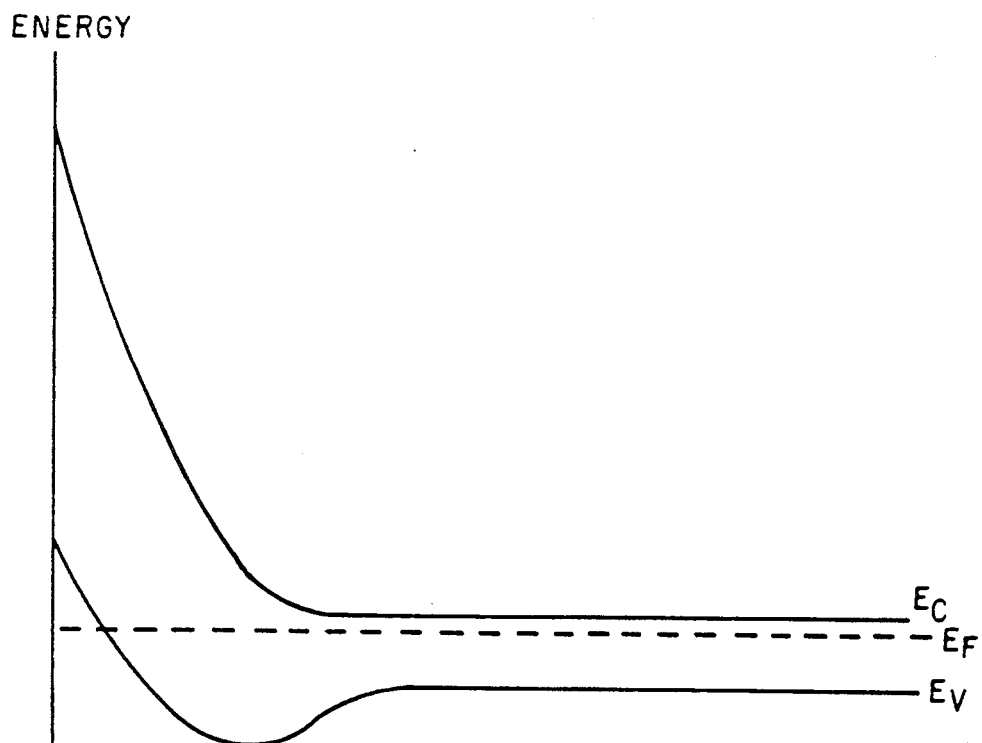

Alternative $Hg_{1-x}Cd_xTe$ heterostructures usable with the first and second preferred embodiments have a compositionally graded structure as illustrated in FIGS. 8a-b. FIG. 8a shows how the composition (x) varies with distance from the passivation layer, and FIGS. 8b-c are the corresponding band diagrams for 0 and $-3$ volts gate biases and are analogous to FIGS. 4a and 4c. The relative curvature of the conduction and valence band edges for an applied gate bias and bandgap gradation can be controlled by variation of the doping level.

Figure 8D:
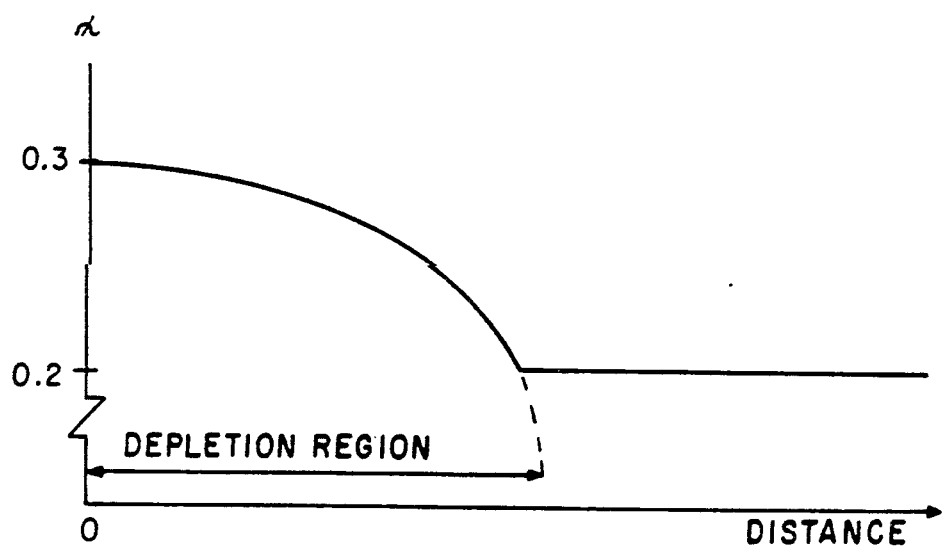

One approach to a graded heterostructure would be to have the electric field througout the initial depletion region approximate the breakdown electric field; this would give the minimum bandgap as a function of distance into the $Hg_{1-x}Cd_xTe$. If the doping of the $Hg_{1-x}Cd_xTe$ is uniform, then the electric field varies linearly with distance (FIG. 2c) and the minimum bandgap as a function of distance is parabolic as shown in FIG. 8d.

Problems with heterostructures in $Hg_{1-x}Cd_xTe$ include self-compensation effects in the layer growth of the wide bandgap layer unless the x value of the $Hg_{1-x}Cd_xTe$ is limited to values such that the intrinsic carier concentration at the growth temperatures employed is greater than the proposed doping concentration, $N_o$. Assuming growth or post-annealing at a minimum temperature of about 200° C., then the x values will probably be limited to $\leq 0.6$.

Another problem with heterostructures in $Hg_{1-x}Cd_xTe$ is the formation of misfit dislocations during growth. The density of these dislocations will depend on the variation of alloy lattice constant with composition. The use of quaternary alloys such as HgCdZnTe with a zinc concentration of approximately 5% should provide a minimal dependence of lattice constant on alloy composition across the complete HgTe to (Cd,Zn)Te range.

Epitaxial techniques of liquid phase epitaxy (LPE) and molecular beam epitaxy (MBE) can be used to grow the heterostructures for the first and second preferred embodiments. LPE typically is carried out at temperature in the 450° to 550° C. range and will thus result in significant interdiffusion in the heterostructure, although this is not detrimental to detector performance. MBE is carried out at 170° to 200° C., and will result in abrupt heterojunctions.

For compositionally graded heterostructures as in FIG. 8a, diffusion methods may be used. For example, U.S. Pat. No. 4,588,446 (Tregilgas) discloses deposition of cadmium or zinc metal on a substrate of $Hg_{1-x}Cd_xTe$ followed by a long, low temperature anneal which results in cadmium or zinc replacing some of the mercury near the surface on a graded basis yielding a compositionally graded substrate near the surface. Alternative methods includes the following preferred embodiment methods illustrated in FIGS. 9a-b.

Figure 9B:
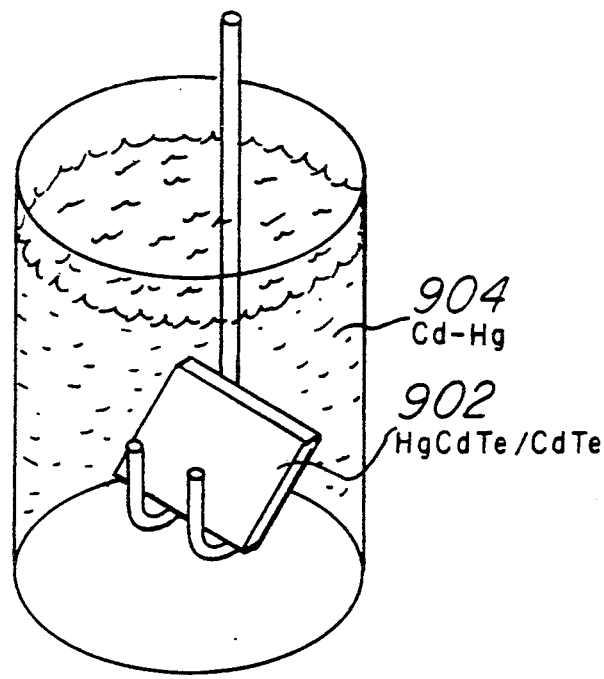
FIGS. 9a–b illustrate preferred embodiment gradation methods.
Figure 9A:
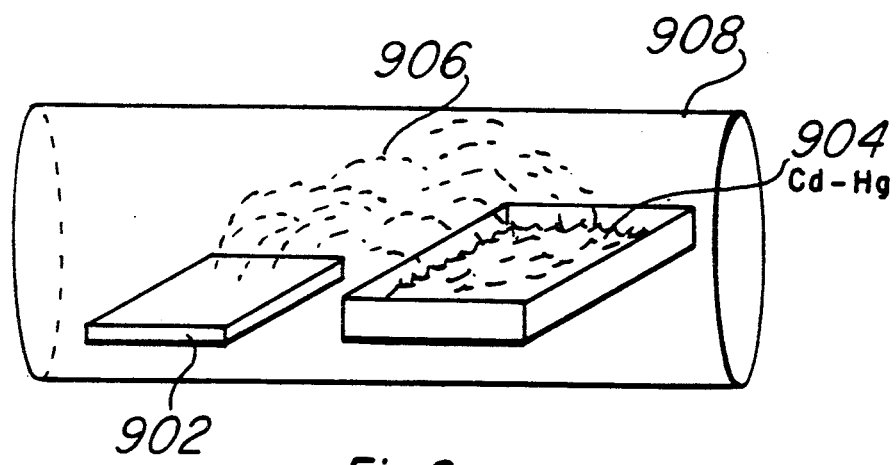

FIG. 9a shows a vapor transport method of compositionally grading the surface region of $Hg_{1-x}Cd_xTe$ substrate 902. Cadmium or zinc from melt 904 is transported by vapors 906 to substrate 902 and diffuses in and replaces mercury which diffuses out. In particular, melt 904 of either pure cadmium or pure zinc can be used to enlarge the surface bandgap of $Hg_{1-x}Cd_xTe$ substrate 902. The use of a pure cadmium melt 904 at a temperature of 400° C. for 15-24 hours produces a dark CdTe-rich surface with hillocks and an underlying nonuniform interdiffused region.

Figure 10A:
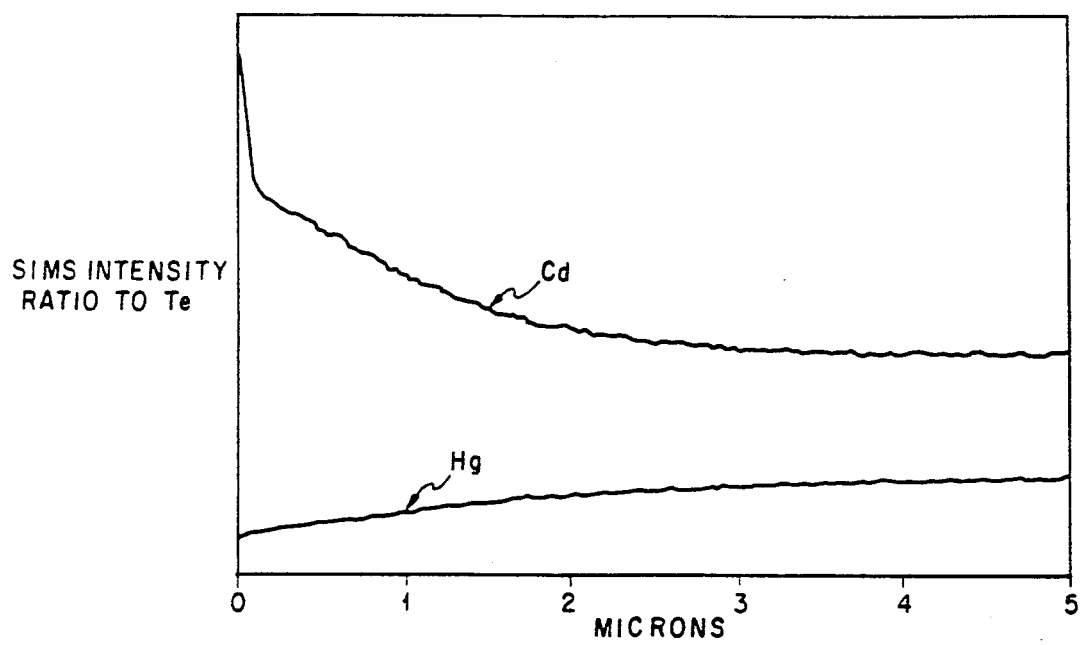
FIGS. 10a–c show results of the preferred embodiment gradation methods.
Figure 10B:
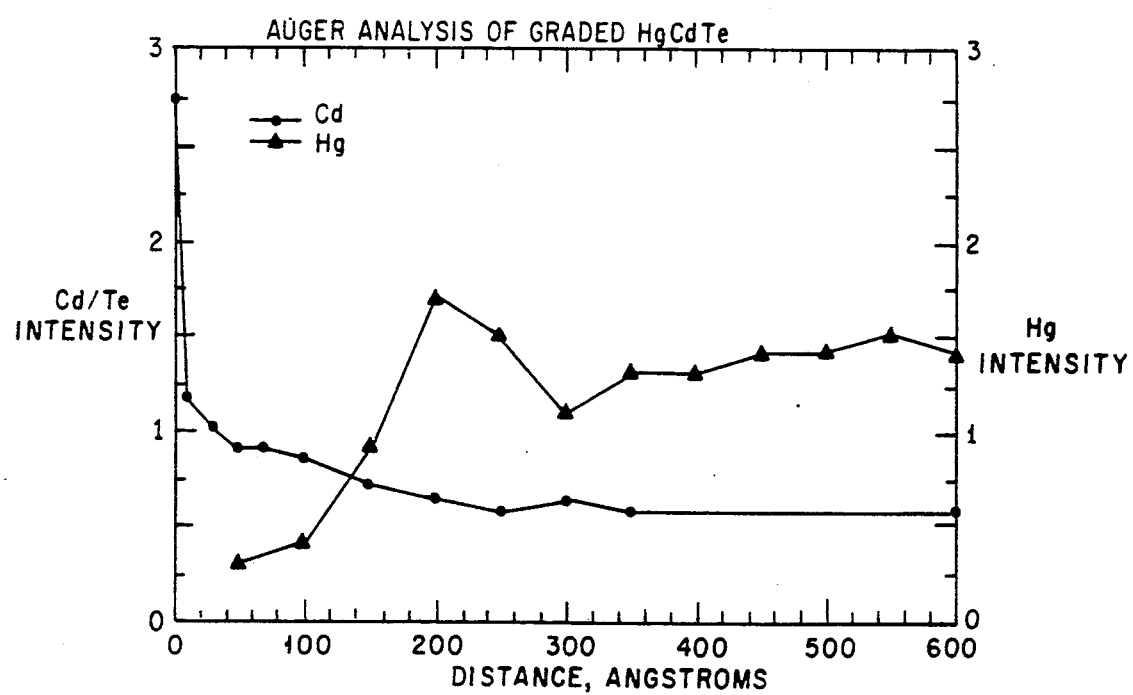
Figure 10C:
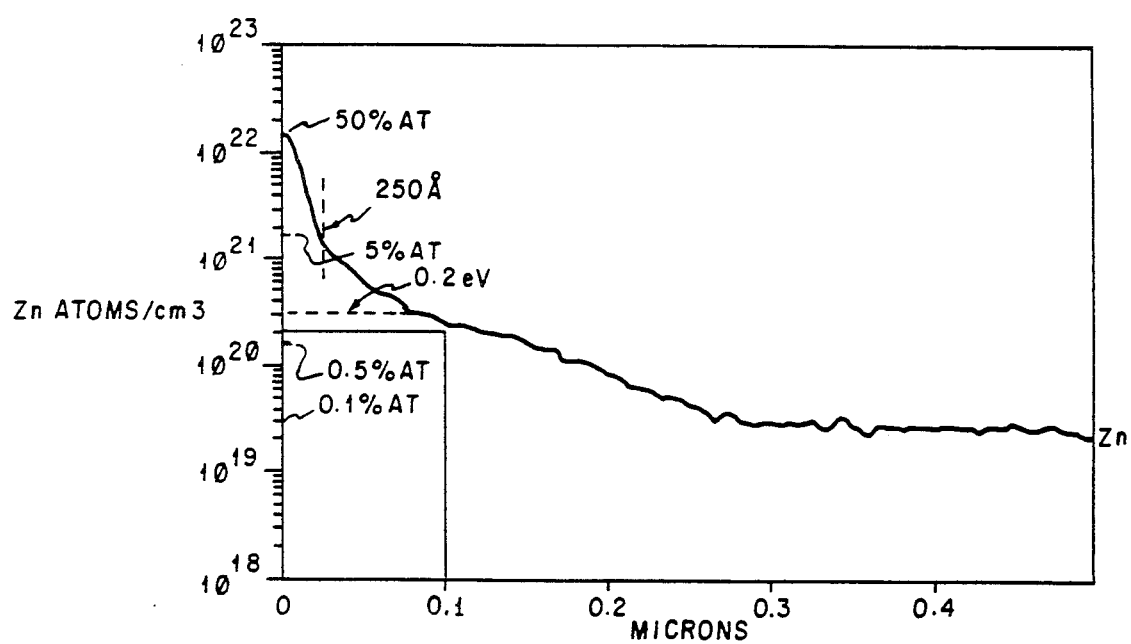

However, vapor transport using alloys of either cadmium or zinc with mercury as melt 904 to provide the cadmium or zinc improves the uniformity of both the surface and the interdiffused regions on substrate 902 of $Hg_{1-x}Cd_xTe$ with $x \approx 0.22$. Sources 904 of cadmium in mercury with the cadmium ranging from about 1% atomic to 18% atomic have been used with annealing temperatures from about 270° C. to 400° C. to produce compositional grading of $Hg_{1-x}Cd_xTe$. For example, using an alloy source composed of 89 mg of cadmium and 484 mg of mercury (a Cd/Hg weight ratio of 0.183) at 400° C. for 15 hours yields a cadmium enriched surface layer approximately 2 μm deep. A compositional profile of this layer using secondary ion mass spectroscopy (SIMS) is shown in FIG. 10a. Another example used a Cd/Hg source with a weight ratio of 0.1 at 270° C. for three days; this example also exhibited a cadmium enriched surface as illustrated by the Auger depth profile of FIG. 10b. In this example the compositional grading is quite shallow, roughly 200 Å, with the substrate surface exhibiting no detectable mercury. The SIMS profile in FIG. 10c shows compositional grading by zinc transport. Enrichment of $Hg_{1-x}Cd_xTe$ surfaces with zinc has produced surface cracking; however, use of mercury/cadmium/zinc melts may prevent cracking. Temperatures in the range of 250° C. to 500° C. should be useful; the higher temperatures imply faster diffusion and increased vapor pressure.

An alternative method is illustrated in FIG. 9b which shows CdTe substrate with $Hg_{1-x}Cd_xTe$ epilayer 902 of size 0.5 mm by 10 mm by 10 mm submerged in molten mercury-cadmium alloy 904 (or molten cadmium or molten mercury-cadmium alloy saturated with tellurium) at 350° C. Saturating melt 904 with tellurium limits the meltback of $Hg_{1-x}Cd_xTe$ epilayer 902. The diffusion of cadmium into epilayer 902 and the diffusion of mercury out creates compositional grading with x varying from about 1.0 to 0.3 near the surface to about the epilayer composition of about 0.2 at a depth of 1-2 μm after several hours or more. The outdiffusion of mercury is slower than the indiffusion of cadmium and determines the time required for a desired depth. Of course, the cadmium activity of melt 904 must exceed that of epilayer 902 to increase the cadmium composition of epilayer 902. Altering melt 904 to increase the percentage of cadmium will speed up the process. Alternatives to the dipping method illustrated in FIG. 9b would include the use of slider boats.

Also, p-type $Hg_{1-x}Cd_xTe$ can be used, although the conduction band discontinuity will then be a barrier to minority carrier (electron) flow and graded bandgap structures analogous to those of FIGS. 8a and 8d are used. Also, if a valence band discontinuity exists then a degree of compositional grading is required for the n-type heterostructure.

The first and second preferred embodiments may be fabricated as follows (not illustrated). For the first preferred embodiment begin with a substrate of $Hg_{0.8}Cd_{0.2}Te$ and grow by MBE a 1 to 4 μm thick epilayer of $Hg_{0.83}Cd_{0.27}Te$. Next, attach the epilayer side of the substrate to a holder and thin the substrate from the back side to a thickness of about 50 μm. Anodically grow oxide on the exposed substrate, and then glue the substrate to a silicon processor chip. Then remove the holder and apply photoresist to define the vias through the $Hg_{1-x}Cd_xTe$ to the silicon process chip pads. Form the vias by RIE etching, and then anodically oxidize the $Hg_{1-x}Cd_xTe$ (epilayer plus vias). Deposit ZnS gate dielectric, deposit gate metal, and use photoresist to pattern and etch the gate metal to form the gates. Deposit ZnS insulation, and use photoresist to form openings to connect the gates to the silicon processor chip pads. Deposit metal and use photoresist to form the connections from gate to silicon processor chip pads. This is a flip-chip process for the $Hg_{1-x}Cd_xTe$ to preserve the top epilayer of wide bandgap material.

The second preferred embodiment may be fabricated as follows. Grow a 10 μm thick epilayer of $Hg_{0.8}Cd_{0.2}Te$ on a CdTe substrate, and then grow a 1 to 4 μm thick second epilayer of $Hg_{0.83}Cd_{0.27}Te$. Anodically sulfidize the $Hg_{1-x}Cd_xTe$, and deposit ZnS gate dielectric and gate metal. Use photoresist to define and etch the gate metal to form the gates, and also to implant channel stops. Use another pattern of photoresist to implant the diode lines and anneal with rapid thermal annealing. Deposit ZnS insulation, transfer gate metal, and use photoresist to define and etch the transfer gate metal to form the transfer gates. Deposit more ZnS insulation and use photoresist to form vias through the ZnS down to the gates. Deposit metal and use photoresist to form the gate busses and complete the array.

The second preferred embodiment array may be attached to a silicon processor chip as with the first preferred embodiment, or field effect transistors may be fabricated directly in the wide bandgap $Hg_{1-x}Cd_xTe$ epilayer and signal processing may be done monolithically, or a combination of the two approaches may be used.

MODIFICATIONS AND ADVANTAGES

Various modifications of the preferred embodiment devices and methods may be made while retaining the features of a heterostructure photosensitive semiconductor, for both two (or more) color detection and increased available potential well capacity.

For example, the dimensions and shapes of the detector elements could be varied, the semiconductor materials could be varied (e.g., HgCdZnTe, HgMnZnTeSe, etc.), the semiconductor composition profiles (and bandgap profiles) could be varied, the composition grading by diffusion methods could be varied as to temperature cycles and melt compositions, and the detector arrays could be integrated in the same substrate as data processing circuitry, and so forth.

The invention provides the advantages of increasing the tunnel breakdown field and reducing the dark currents of the narrow bandgap detector material, increasing the available well capacity, simple two (or more) color detection, and simple compositional grading methods.

What is claimed is:

1. A radiation detector, comprising:
   (a) an insulated gate over a layer of semiconductor material, said material with a first bandgap adjacent said gate and a second bandgap a depletion region depth from said gate, said first bandgap larger than said second bandgap, and said second bandgap of energy comparable to the energy of at least a portion of photons of radiation to be detected;
   (b) a potential source intermittently connected between said gate and said layer; and
   (c) a gate potential detector.
2. The detector of claim 1, wherein:
   (a) said semiconductor material is $Hg_{1-x}Cd_xTe$, with $x=x_1$ from adjacent said gate to a first depth and with $x=x_2$ from a first depth to a second depth.
3. The detector of claim 2, wherein:
   (a) $x_1 \approx 0.27$ and $x_2 \approx 0.2$.
4. The detector of claim 2, wherein:
   (a) $x_1 \approx 0.3$ and $x_2 \approx 0.2$.
5. The detector of claim 2, wherein:
   (a) said potential source has at least first and second potential levels, said levels characterized by said first potential level applied between said gate and said layer creates a depletion region extending to a depth less than or equal to said first depth and said second potential level applied between said gate and said layer creates a depletion region extending to a depth greater than said first depth.
6. The detector of claim 1, wherein:
   (a) said semiconductor material is $Hg_{1-x}Cd_xTe$, with x continuously decreasing from adjacent said gate to a first depth.
7. An infrared imager, comprising:
   (a) a plurality of pixels formed on a layer of semiconductor material, each of said pixels including:
      i. an insulated gate over said layer, said material with a first bandgap adjacent said gates and a second bandgap a depletion region depth from said gates, said first bandgap larger than said second bandgap, and said second bandgap of energy comparable to the energy of at least a portion of photons of infrared radiation to be detected;
   (b) a source of potential intermittently connected between each of said gates and said layer; and
   (c) a potential detector intermittently connected to each of said gates.
8. The imager of claim 7, wherein:
   (a) said semiconductor material is $Hg_{1-x}Cd_xTe$, with $x=x_1$ from adjacent said gate to a first depth and with $x=x_2$ from a first depth to a second depth.
9. The imager of claim 8, wherein:
   (a) $x_1 \approx 0.27$ and $x_2 \approx 0.2$.
10. The image of claim 8, wherein:
    (a) $x_1 \approx 0.3$ and $x_2 \approx 0.2$.
11. The imager of claim 8, wherein:
    (a) said potential source has at least first and second potential levels, said levels characterized by said first potential level applied between one of said gates and said layer creates a depletion region extending to a depth less than or equal to said first depth and said second potential level applied between said one gate and said layer creates a depletion region extending to a depth greater than said first depth.
12. The imager of claim 7, wherein:
    (a) said semiconductor material is $Hg_{1-x}Cd_xTe$, with x continuously decreasing from adjacent said gate to a first depth.
13. A method of detection of radiation, comprising the steps of:
    (a) providing a layer of semiconductor material with bandgap decreasing with depth and with a gate over said layer;
    (b) intermittently applying a potential between said gate and said layer; and
    (c) intermittently detecting the potential on said gate.
14. The method of claim 13, wherein:
    (a) said intermittently applied potential has first and second levels and thereby creates first and second depth depletion regions in said layer with second depth regions extending into smaller bandgap material than said first depth regions.

* * * * *